United States Patent
Tsukamoto

(10) Patent No.: US 9,214,405 B2
(45) Date of Patent: Dec. 15, 2015

(54) SEMICONDUCTOR MODULE HAVING HEAT DISSIPATING PORTION

(71) Applicant: Tadashi Tsukamoto, Toyota (JP)

(72) Inventor: Tadashi Tsukamoto, Toyota (JP)

(73) Assignee: Toyota Jidosha Kabushiki Kaisha, Toyota-shi (JP)

(*) Notice: Subject to any disclaimer, the term of this patent is extended or adjusted under 35 U.S.C. 154(b) by 0 days.

(21) Appl. No.: 14/161,054

(22) Filed: Jan. 22, 2014

(65) Prior Publication Data

US 2014/0210072 A1 Jul. 31, 2014

(30) Foreign Application Priority Data

Jan. 29, 2013 (JP) ................. 2013-014672

(51) Int. Cl.
| | |
|---|---|
| *H01L 23/34* | (2006.01) |
| *H01L 23/10* | (2006.01) |
| *H01L 23/495* | (2006.01) |
| *H01L 23/367* | (2006.01) |
| *H01L 23/40* | (2006.01) |
| *H01L 23/50* | (2006.01) |
| *H01L 23/14* | (2006.01) |

(52) U.S. Cl.
CPC .......... *H01L 23/367* (2013.01); *H01L 23/4006* (2013.01); *H01L 23/50* (2013.01); *H01L 23/147* (2013.01); *H01L 2023/4056* (2013.01); *H01L 2924/0002* (2013.01)

(58) Field of Classification Search
CPC ... H01L 23/36; H01L 23/367; H01L 23/4006; H01L 2224/48091; H01L 2924/01079; H01L 2924/01078; H01L 2924/15311; H01L 2924/01013; H01L 2023/405; H01L 23/4334; H01L 2224/48247; H01L 23/50; H01L 23/147; H01L 2023/4056; H01L 2924/0002
USPC .................. 257/717, 720, 722, 712, 706, 675
See application file for complete search history.

(56) References Cited

U.S. PATENT DOCUMENTS

| | | | |
|---|---|---|---|
| 6,357,514 | B1 | 3/2002 | Sasaki et al. |
| 2004/0026777 | A1 | 2/2004 | Yokoyama et al. |
| 2006/0052914 | A1* | 3/2006 | Kubokawa et al. ............. 701/21 |
| 2006/0250198 | A1* | 11/2006 | Meltzer et al. ................ 333/185 |
| 2007/0154365 | A1* | 7/2007 | Matsuno .................. 422/186.07 |
| 2011/0148516 | A1* | 6/2011 | Tanaka et al. .................. 327/564 |

FOREIGN PATENT DOCUMENTS

| | | |
|---|---|---|
| JP | 11-045977 A | 2/1999 |
| JP | 2001-057405 A | 2/2001 |
| JP | 2004-071977 A | 3/2004 |
| JP | 2012-079837 A | 4/2012 |

* cited by examiner

*Primary Examiner* — A. Sefer
*Assistant Examiner* — Dilinh Nguyen
(74) *Attorney, Agent, or Firm* — Dinsmore & Shohl LLP

(57) ABSTRACT

A semiconductor module includes a control board, and a shield plate arranged opposing the control board. A metal first heat dissipating portion is provided on a surface of the control board. A metal second heat dissipating portion is provided on a first surface of the shield plate, opposing the surface of the control board. A dielectric body is arranged between the first heat dissipating portion and the second heat dissipating portion.

16 Claims, 7 Drawing Sheets

SEMICONDUCTOR MODULE HAVING HEAT DISSIPATING PORTION

INCORPORATION BY REFERENCE

The disclosure of Japanese Patent Application No. 2013-014672 filed on Jan. 29, 2013 including the specification, drawings and abstract is incorporated herein by reference in its entirety.

BACKGROUND OF THE INVENTION

1. Field of the Invention

The technology described in this specification relates to a semiconductor module.

2. Description of Related Art

Japanese Patent Application Publication No. 11-045977 (JP 11-045977 A) describes a multichip module that has stacked structure in which an active element substrate having a bare chip part, a passive element substrate having a resistor and a capacitor and the like, and a metal shield plate, are stacked together in this order. With this multichip module, thermal conductivity is greater, using a metal plate than it is using an insulating substrate as the base substrate that forms the active element substrate, so heat is able to be better dissipated from the bare chip part.

Typically, with a semiconductor module provided with a semiconductor element that consumes a large amount of power, cooling the semiconductor element becomes an issue. With the multichip module described in JP 11-045977 A, the semiconductor element is able to be cooled using a metal plate as the base substrate that forms the active element substrate. However, this multichip module is a multi-layered structure in which a plurality of substrates and a shield plate are stacked together, so it is difficult to sufficiently transfer heat in the substrate stacking direction. Thus, heat from a semiconductor element that consumes a large amount of power may not be able to be sufficiently dissipated just by using a metal plate for the base substrate that forms the active element substrate. One way to more appropriately cool a semiconductor element that consumes a large amount of power is to mount a radiator to the substrate. However, many elements including a capacitor and so on are mounted on the substrate, and it is difficult to mount a radiator in addition to these elements due to spatial constraints. Also, even if a radiator were able to be mounted, space for mounting other elements would be limited by the space taken up by the radiator, so the degree of freedom in design would decrease.

SUMMARY OF THE INVENTION

The invention thus provides a semiconductor module capable of appropriately cooling a semiconductor element, while inhibiting a decrease in the degree of freedom in design.

One aspect of the invention relates to semiconductor module that includes a control board, and a shield plate arranged opposing the control board. A metal first heat dissipating portion is provided on a surface of the control board. A metal second heat dissipating portion is provided on a first surface of the shield plate, the first surface opposing the surface of the control board. A dielectric body is arranged between the first heat dissipating portion and the second heat dissipating portion.

With this semiconductor module, the metal first heat dissipating portion is provided on the surface of the control board, and the metal second heat dissipating portion is provided on the first surface of the shield plate. The surface of the control board on which the first heat dissipating portion is provided and the first surface of the shield plate on which the second heat dissipating portion is provided are opposing each other. Therefore, when the semiconductor module operates and an element on the control board generates heat, the heat released from the element is able to be transferred from the first heat dissipating portion to the second heat dissipating portion provided on the shield plate. The heat generated by the element is able to be transferred in the stacking direction, so the element on the control board is able to be suitably cooled. Hereinafter, the first heat dissipating portion and the second heat dissipating portion may collectively be referred to as a "radiator". A dielectric body is arranged between the first heat dissipating portion and the second heat dissipating portion. As a result, a capacitor in which the first heat dissipating portion and the second heat dissipating portion are electrodes is formed between the control board and the shield plate. According to this structure, the radiator and the capacitor are not mounted separately, so space is able to be saved. Therefore, a decrease in the degree of freedom of design is able to be inhibited.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
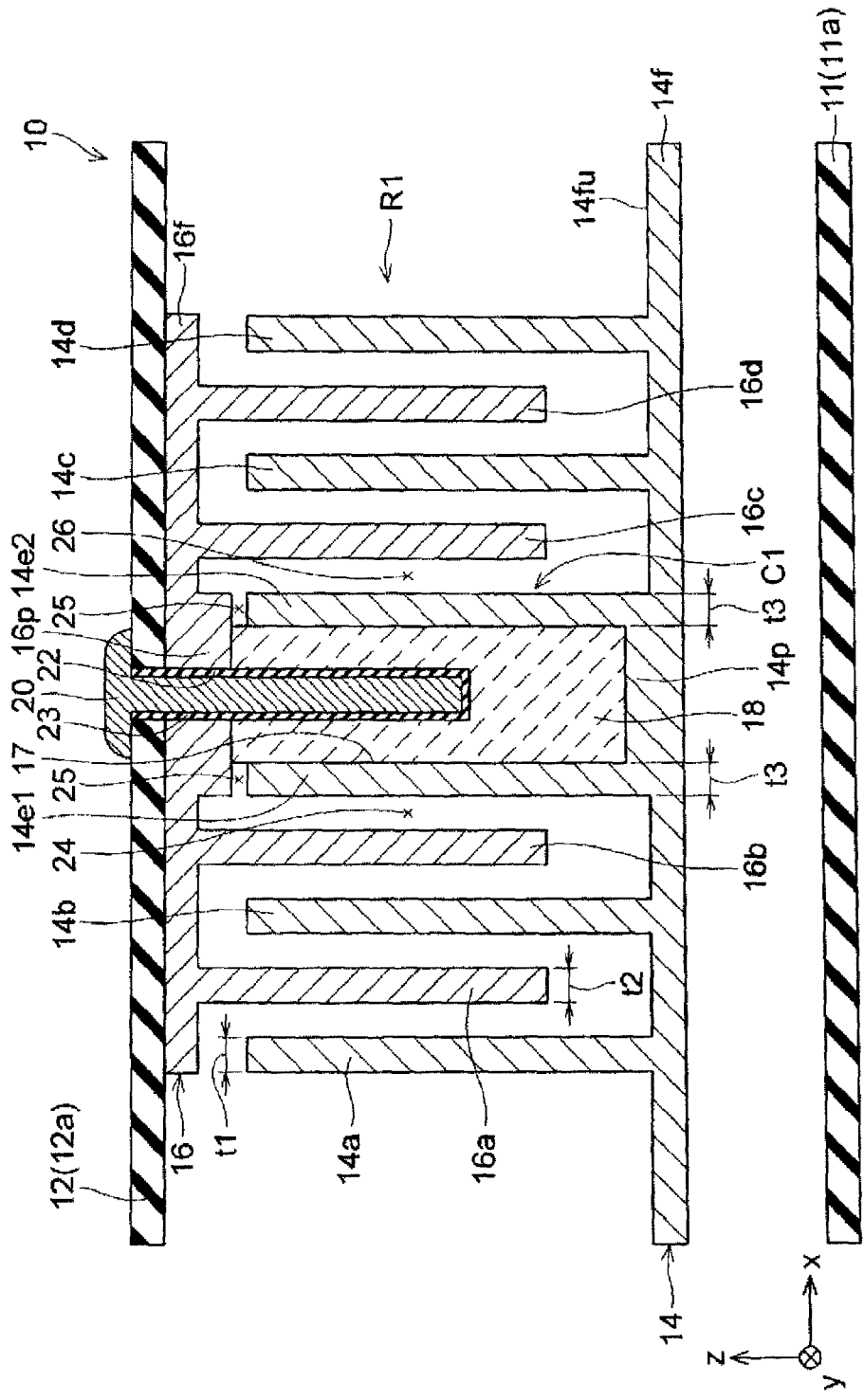
FIG. 1 is a sectional view of a semiconductor module according to a first example embodiment of the invention.

The technical elements described below are independent technical elements that exert technical utility both alone and in various combinations.

In the semiconductor module according to the example embodiments of the invention, a surface of a control board and a first surface of a shield plate may be parallel to each other. A first heat dissipating portion provided on the control board may have a plurality of first radiation fins, and a second heat dissipating portion provided on the shield plate may have a plurality of second radiation fins. The first radiation fins may extend from the control board toward the shield plate, and the second radiation fins may extend from the shield plate toward the control board. The first radiation fins and the second radiation fins may be arranged alternately in a direction parallel to the first surface. According to this structure, the surface areas of the first heat dissipating portion and the second heat dissipating portion both increase due to the first radiation fins and the second radiation fins. Also, at least a portion of a side surface of the plurality of first radiation fins opposes at least a portion of the plurality of second radiation fins. According to this structure, heat released from a semiconductor element on the control board is transferred from the side surfaces of the first radiation fins to the side surfaces of the second radiation fins, so heat dissipation performance improves. As a result, the semiconductor element is able to be more efficiently cooled.

With the semiconductor module of the example embodiments of the invention, a space may be formed by the first radiation fins of the first heat dissipating portion and the second radiation fins of the second heat dissipating portion. According to this structure, heat transfer between the radiation fins by radiation is able to be promoted, while the first radiation fins provided on the control board are electrically insulated from the second radiation fins provided on the shield plate.

With the semiconductor module of the example embodiments of the invention, a module equipped with an Insulated Gate Bipolar Transistor (IGBT) may be arranged on a second surface of the shield plate. An IGBT generates a large amount of heat, so a module equipped with an IGBT may be cooled with coolant. In this case, the heat generated by the control board is transferred to the module equipped with the IGBT via the shield plate, and dissipated from the module equipped with the IGBT to coolant. Therefore, heat generated by an element mounted on the control board is able to be efficiently dissipated to the outside.

A semiconductor module 10 according to a first example embodiment of the example embodiment will now be described with reference to the accompanying drawings. The semiconductor module 10 includes an IPM substrate 12, a shield plate 14, and an IGBT module 11. The IPM substrate 12 controls the IGBT module 11. The IPM substrate 12 is made up of a substrate 12a, and a semiconductor element, not shown, mounted on the substrate 12a. An Si substrate, for example, may be used as the substrate 12a, but the invention is not limited to this. That is, another well-known substrate may also be used. A semiconductor element, not shown, that consumes a large amount of power, such as a MOSFET, is mounted to an upper surface (i.e., the surface on the z direction side in FIG. 1) of the substrate 12a. A metal member 16 made of copper is attached to a lower surface (i.e., the surface on the −z direction side in FIG. 1) of the substrate 12a. The metal member 16 is attached to the substrate 12a by brazing or a crimping method, for example. The method by which the metal member 16 is attached to the substrate 12a is not limited to these methods. The metal member 16 may also be attached to the substrate 12a by another method. The metal member 16 has a plurality of radiation fins 16a to 16d, and a protruding portion 16p that will be described later. The shield plate 14 that is made of copper is arranged parallel to the IPM substrate 12, below the IPM substrate 12. A plurality of radiation fins 14a to 14e and a protruding portion 14p are formed by press-forming, on an upper surface of the shield plate 14 (i.e., a surface that opposes the lower surface of the IPM substrate 12). The IGBT module 11 is arranged parallel to the shield plate 14, below the shield plate 14. The IGBT module 11 converts direct current (DC) power that is input, into alternating current (AC) power, and outputs the converted AC power to a load device (an electric motor, for example). The IGBT module 11 includes a substrate 11a, and a plurality of IGBTs, not shown, mounted on the substrate 11a. DC power is converted into AC power by the plurality of IGBTs being controlled on and off by the IPM substrate 12. The IGBT module 11 is cooled with coolant because heat is generated when the IGBTs turn on and off. The IPM substrate 12 may be regarded as one example of the control board of the invention, the metal member 16 may be regarded as one example of the first heat dissipating portion of the invention, and the radiation fins 16a to 16d may be regarded as one example of the first radiation fins of the invention.

Figure 2:
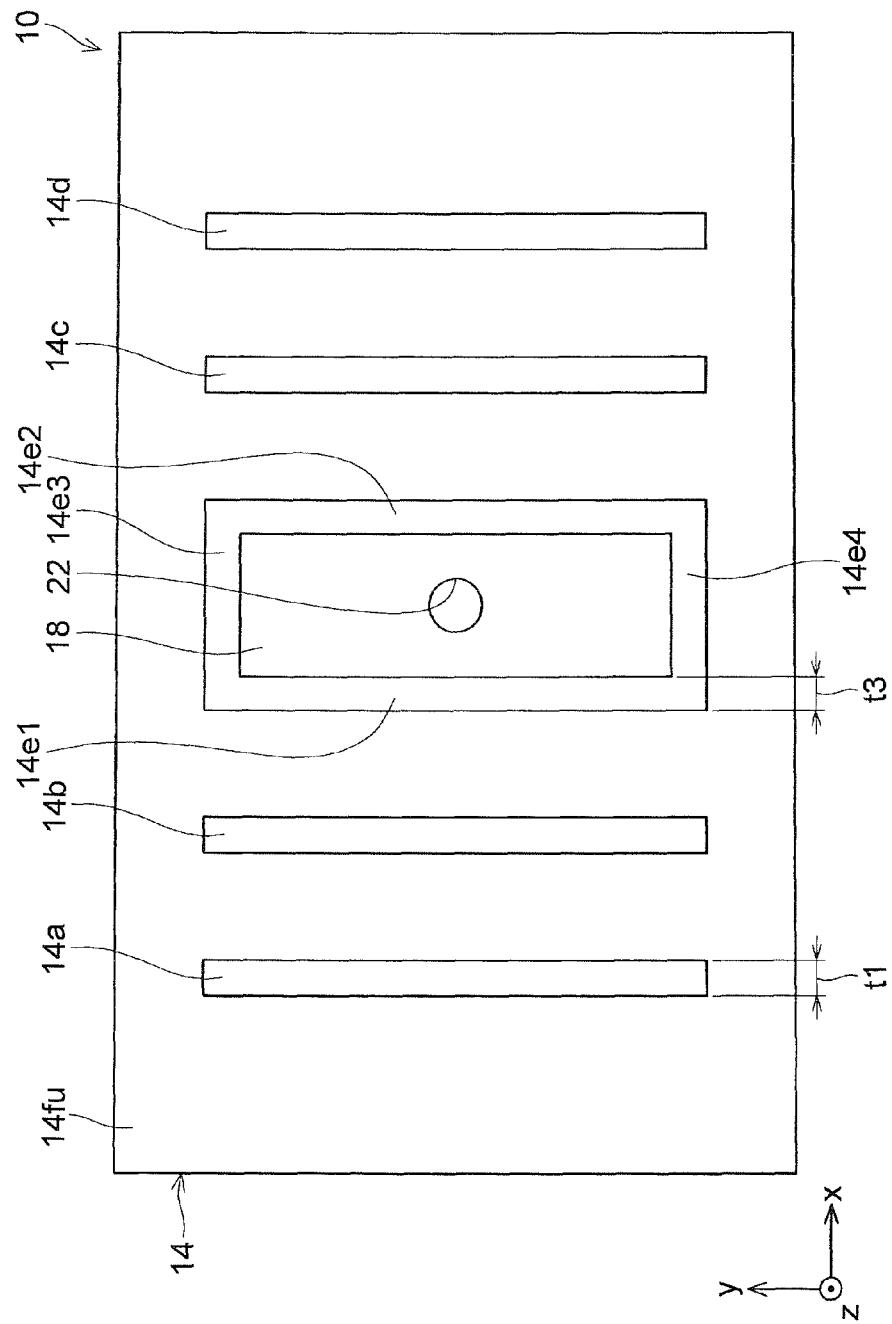
FIG. 2 is a plan view of the semiconductor module according to the first example embodiment.

Here, the radiation fins 14a to 14e and the protruding portion 14p will be described with reference to FIGS. 1 and 2. FIG. 2 is a plan view of the semiconductor module 10. In FIG. 2, the IPM substrate 12, the metal member 16, a screw 20 (that will be described later), and an insulating film 23 (that will also be described later) are omitted to make the drawing easier to see. Below, of the shield plate 14, the shield plate 14 that expands flat in a xy plane will be specifically referred to as "shield flat plate 14f", and an upper surface of the shield flat plate 14f will be specifically referred to as "shield flat plate upper surface 14fu" to simplify the description. As shown in FIG. 1, the radiation fins 14a to 14e extend in a direction perpendicular to the shield flat plate upper surface 14fu (i.e., the z direction). Also, as shown in FIGS. 1 and 2, of the radiation fins 14a to 14e, the radiation fins 14a to 14d have generally the same shape, which is a flat plate shape that extends long in the y direction. The radiation fins 14a to 14d are formed such that wide surfaces thereof are parallel and oppose each other. On the other hand, the radiation fin 14e is formed by four side walls 14e1 to 14e4. More specifically, the side walls 14e1 and 14e2 are arranged apart in the x direction, and are formed in generally the same shape as the radiation fins 14a to 14d. The side wall 14e1 is such that a wide surface thereof is parallel to and opposes the wide surface of the side wall 14b. The side wall 14e2 is such that a wide surface thereof is parallel to and opposes the wide surface of the side wall 14c. The side walls 14e3 and 14e4 have flat plate shapes, with heights thereof (i.e., the length in the z direction) being equal to the heights of the side walls 14e1 and 14e2, and widths thereof being equal to the distance between the two side walls 14e1 and 14e2. As shown in FIG. 2, the side walls 14e3 and 14e4 are formed such that wide surfaces thereof between end portions in the y direction and the −y direction of the side walls 14e1 and 14e2 are parallel and oppose each other. Also, a thickness of all of the side walls 14e1 to 14e4 is the same (hereinafter, referred to as thickness t3), and this thickness t3 is substantially the same as a thickness t1 of the radiation fins 14a to 14d. That is, the side walls 14e1 to 14e4 form the side surfaces of a quadrangular prism that is rectangular with a long cross section in the y direction. The radiation fin 14e is formed by the side walls 14e1 to 14e4. As shown in FIG. 1, the protruding portion 14p is formed on a bottom surface (the surface in the −z direction) of the quadrangular prism described above. Therefore, a cavity 17 that is surrounded by the radiation fin 14e and the protruding portion 14p is formed in the shield plate 14. In this example embodiment, the distance between adjacent radiation fins 14a to 14d, and between the side walls 14e1 and 14e2 is substantially the same, but the distance between the radiation fins may also be different. The radiation fins 14a to 14e and the protruding portion 14p may be regarded as one example of the second heat dissipating portion of the invention, and the radiation fins 14a to 14e may be regarded as one example of the second radiation fins of the invention.

An alumina plate 18 having a sectional shape substantially the same as the sectional shape of the cavity 17 in the xy planar direction is arranged in the cavity 17 formed by the radiation fin 14e and the protruding portion 14p. As is evident from FIG. 1, a position of a z direction tip end of the alumina plate 18 is higher than a position of a z direction tip end of the radiation fin 14e. That is, when the alumina plate 18 is arranged such that a bottom surface thereof is contacting a bottom surface of the cavity 17, an upper end of the alumina plate 18 protrudes slightly from an upper end surface of the radiation fin 14e. An upper end of the alumina plate 18 contacts the protruding portion 16p of the metal member 16.

As shown in FIGS. 1 and 2, a screw hole for screwing in a screw 20, that will be described later, is formed in the alumina plate 18. This screw hole extends in the −z direction from substantially the center portion of the upper surface of the alumina plate 18. Also, a screw hole having thread grooves identical to the screw hole formed in the alumina plate 18 is also formed in both the IPM substrate 12 and the metal member 16, such that the screw hole passes through both the IPM substrate 12 and the metal member 16 in the z direction. The screw holes formed in the alumina plate 18, the IPM substrate 12, and the metal member 16, together form a screw hole 22 into which the screw 20 is screwed. An insulating film 23 is formed on an inner peripheral surface and a bottom surface of the screw hole 22. The IPM substrate 12, the metal member 16, and the alumina plate 18 are fastened contacting each other in this order by screwing the screw 20 into the screw hole 22. The alumina plate 18 is arranged between the protruding portion 16p of the metal member 16, and the radiation fin 14e and the protruding portion 14p of the shield plate 14 by fastening the IPM substrate 12, the metal member 16, and the alumina plate 18 together in this way.

Figure 3:
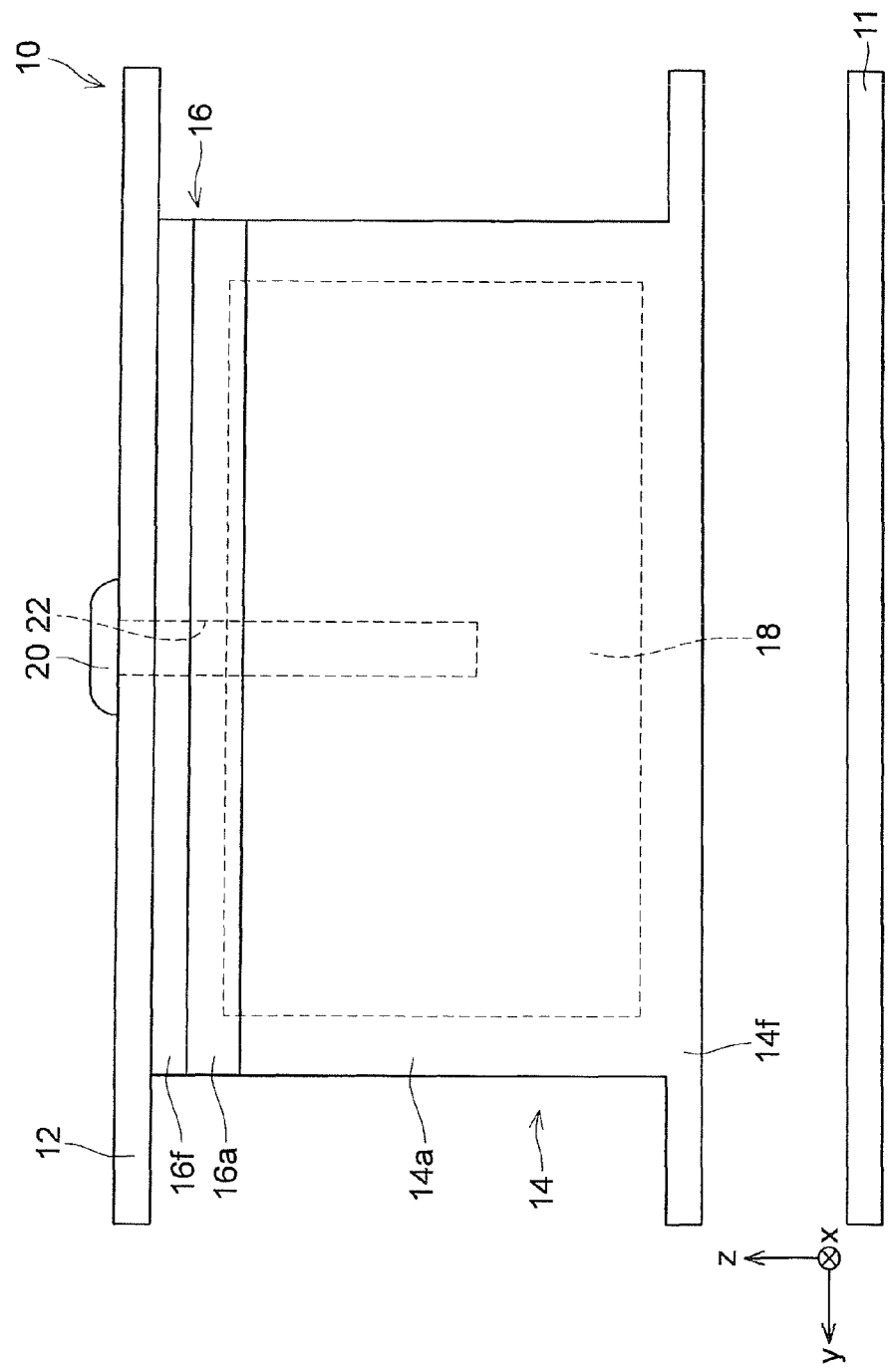
FIG. 3 is a side view of the semiconductor module according to the first example embodiment.

Next, the metal member 16 will be described with reference to FIGS. 1 to 3. FIG. 3 is a side view of the semiconductor module 10, and shows the semiconductor module 10 in FIG. 1 from the left side of the paper on which FIG. 1 is drawn. As described above, the metal member 16 has the radiation fins 16a to 16d and the protruding portion 16p. Here, to simplify the description, a portion of the metal member 16 that expands flat in the xy plane will be specifically referred to as "metal flat plate 16f" below. The radiation fins 16a to 16d and the protruding portion 16p extend in a direction perpendicular to a lower surface of the metal flat plate 16f (i.e., in the −z direction). The radiation fins 16a to 16d have generally the same shape, which is a flat plate shape that extends long in the y direction. The radiation fins 16a to 16d are formed such that wide surfaces thereof are parallel and oppose each other. As shown in FIG. 3, a length of the radiation fins 16a to 16d and the protruding portion 16p in the y direction is substantially the same as the length of the radiation fins 14a to 14d in the y direction. Also, the length of the protruding portion 16p in the z direction is significantly shorter than the length of the radiation fins 16a to 16d in the z direction. The distance between the radiation fins 16a and 16b in the x direction is substantially the same as the distance between the radiation fins 16c and 16d in the x direction.

Continuing on, the positional relationship between the radiation fins 14a to 14e formed on the shield plate 14 and the radiation fins 16a to 16d and the protruding portion 16p of the metal member 16 will now be described with reference to FIG. 1. As shown in FIG. 1, the radiation fins 14a to 14e and the radiation fins 16a to 16d are arranged alternately in the x direction. More specifically, a thickness t2 of the radiation fins 16a to 16d is smaller than the distance between adjacent radiation fins 14a to 14e in the x direction, so the radiation fins 16a to 16d are positioned between adjacent radiation fins 14a to 14e. Also, the radiation fins 14a to 14e are formed perpendicular to the shield flat plate upper surface 14fu, and the radiation fins 16a to 16d are formed perpendicular to the lower surface of the metal flat plate 16f, so the shield flat plate 14f and the metal flat plate 16f are arranged parallel to each other. Therefore, the radiation fins 16a to 16d, and the radiation fins 14a to 14d and the radiation fin 14e are arranged such that the wide surfaces of the radiation fins are parallel and oppose each other. Also, a space is formed between the radiation fins 16a to 16d and the radiation fins 14a to 14e that are alternately arranged. Further, the length of the radiation fins 14a to 14e in the z direction, and the length of the radiation fins 16a to 16d in the z direction are both shorter than the distance between the shield flat plate upper surface 14fu and the lower surface of the metal flat plate 16f, so the upper surface of the radiation fins 14a to 14e will not contact the lower surface of the metal flat plate 16f. Similarly, the lower surface of the radiation fins 16a to 16d will not contact the shield flat plate upper surface 14fu. Therefore, on both sides (i.e., in the x direction and the −x direction in FIG. 1) of the radiation fin 14e, spaces 24 formed between alternately arranged radiation fins are connected together, and similarly, spaces 26 are also connected together. Moreover, the wide surfaces of the radiation fins 16a to 16d and the radiation fins 14a to 14e that are alternately arranged oppose each other for only a portion of the height of the radiation fins 16a to 16d and 14a to 14e, not the entire height of the radiation fins 16a to 16d and 14a to 14e. As a result, a radiator R1 is formed by the radiation fins 16a to 16d and the radiation fins 14a to 14e. Also, as described above, the screw 20 is screwed into the screw hole 22 from the upper surface of the IPM substrate 12 such that the lower surface of the protruding portion 16p of the metal member 16 contacts the upper surface of the alumina plate 18. Because the height of the upper surface of the radiation fin 14e is lower than the height of the upper surface of the alumina plate 18 in the z direction, the lower surface of the protruding portion 16p will not contact the upper surface of the radiation fin 14e, so a space 25 is formed. As a result, a capacitor C1 is formed.

Next, the advantages of the semiconductor module 10 according to the first example embodiment will be described. In the first example embodiment, the radiation fins 14a to 14e are formed by press-forming, on the shield plate 14 that is conventionally flat. Also, the metal member 16 that has the radiation fins 16a to 16d is attached to the lower surface of the IPM substrate 12, and the shield plate 14 and the IPM substrate 12 are arranged such that the wide surfaces of the radiation fins 14a to 14e are parallel to and oppose the wide surfaces of the radiation fins 16a to 16d. The spaces 24 and 26 are formed between the opposing radiation fins 14a to 14e and radiation fins 16a to 16d. As a result, the radiator R1 is formed. Also, in this first example embodiment, the alumina plate 18 is arranged in the cavity 17 formed by the radiation fin 14e and the protruding portion 14p, so the alumina plate 18 is sandwiched by the protruding portion 16p of the metal member 16, and the radiation fin 14e and the protruding portion 14p. As a result, the AC coupling capacitor C1 that has the protruding portion 16p, and the radiation fin 14e and the protruding portion 14p as electrodes is formed. That is, in the first example embodiment, the radiator R1 and the capacitor C1 are integrally formed between the IPM substrate 12 and the shield plate 14. Therefore, compared to when a radiator is arranged on the IPM substrate 12 separately from a capacitor, space is able to be saved, so the degree of freedom of design is able to be prevented from decreasing.

Also, the surface area of the shield plate 14 and the surface area of the metal member 16 both increase by forming the radiation fins 14a to 14e and the radiation fins 16a to 16d. Also, the area of the opposing portion of the radiation fins 14a to 14e and the radiation fins 16a to 16d increases by alternatively arranging the radiation fins 14a to 14e and the radiation fins 16a to 16d in the x direction. Thus, the heat transfer efficiency from the IPM substrate 12 to the shield plate 14 significantly increases compared to when the shield plate 14 is flat or the metal member 16 is not provided. Therefore, when the semiconductor module 10 is operating and heat is released from elements mounted on the IPM substrate 12, this heat is efficiently radiated from the radiation fins 16a to 16d to the radiation fins 14a to 14e via the IPM substrate 12, and transferred from the shield plate 14 to the IGBT module 11. Because the IGBT module 11 is cooled with coolant, the IPM substrate 12 is able to be efficiently cooled.

Also, in this example embodiment, the radiator R1 is formed on a surface (hereinafter, referred to as the "lower surface of the IPM substrate 12") on the side opposite the side on which the elements are mounted, so the capacitor C1 is able to be formed on the lower surface of the IPM substrate 12. As a result, the capacity of the capacitor C1 is able to be set relatively freely. Therefore, a large capacity capacitor C1 is able to be formed, so noise resistance is able to be improved. Also, elements on the IPM substrate 12 are able to be cooled from the lower surface of the IPM substrate 12. Furthermore, in this example embodiment, the members provided for heat dissipation (i.e., the radiation fin 14e and protruding portion 14p, and the protruding portion 16p) are used as electrodes of the capacitor C1. Therefore, electrodes for the capacitor C1 do not have to be newly formed. As a result, the cost associated with the capacitor is able to be reduced, compared to when the capacitor is mounted alone.

Also, the metal member 16 is attached to the lower surface of the IPM substrate 12, so the rigidity of the IPM substrate 12 is able to be ensured. Further, the IPM substrate 12 is able to be grounded using the metal member 16 that is attached to the IPM substrate 12.

Figure 4:
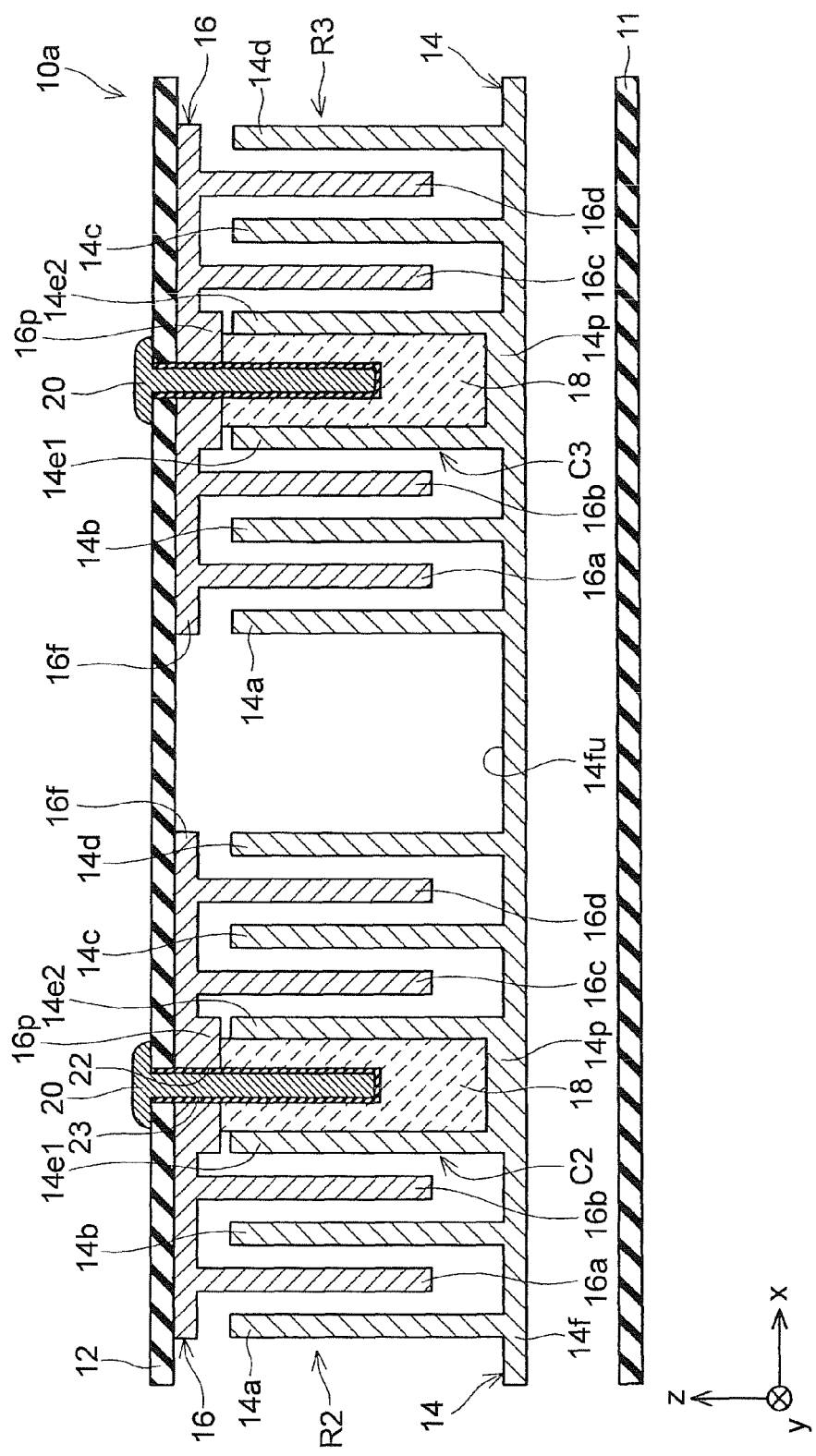
FIG. 4 is a sectional view of a semiconductor module according to a modified example of the first example embodiment.

Next, a first modified example of the first example embodiment will be described with reference to FIG. 4. Hereinafter, only points that differ from the first example embodiment will be described. Detailed descriptions of structure that is the same as that in the first example embodiment will be omitted.

A semiconductor module 10a according to the first modified example has two same-structure capacitors C2 and C3, and two same-structure radiators R2 and R3 formed between the IPM substrate 12 and the shield flat plate 14f of the shield plate 14. More specifically, two same-shape metal members 16 are attached to the lower surface of the IPM substrate 12, and a plurality of radiation fins 14a to 14e are formed in positions opposing the metal member 16 in the z direction, on a shield flat plate upper surface 14fu. That is, two sets of same-shape radiation fins 14a to 14e are formed on the shield flat plate upper surface 14fu. This structure also provides the same advantages as those provided by the first example embodiment. Also, the IPM substrate 12 is locally cooled by the radiators R2 and R3. Also, noise resistance improves by forming a plurality of the capacitors. In the first modified example, the structure of the radiators R2 and R3 is the same, but the radiators may also have different structures by changing the number of radiation fins or the like. Changing the position or number of the radiation fins makes it possible to control the cooling performance and cooling location of the IPM substrate 12. Also, a capacitor having a different capacity may be formed by providing a dielectric body other than the alumina plate 18. At this time, the dielectric body is preferably made of material having high permittivity and high thermal conductivity. Also, a plurality of capacitors may be formed within one radiator. Also, depending on the location where the radiator is arranged, the capacitor does not have to be formed in the center portion of the radiator, but may instead be formed on an end portion of the radiator.

Figure 5:
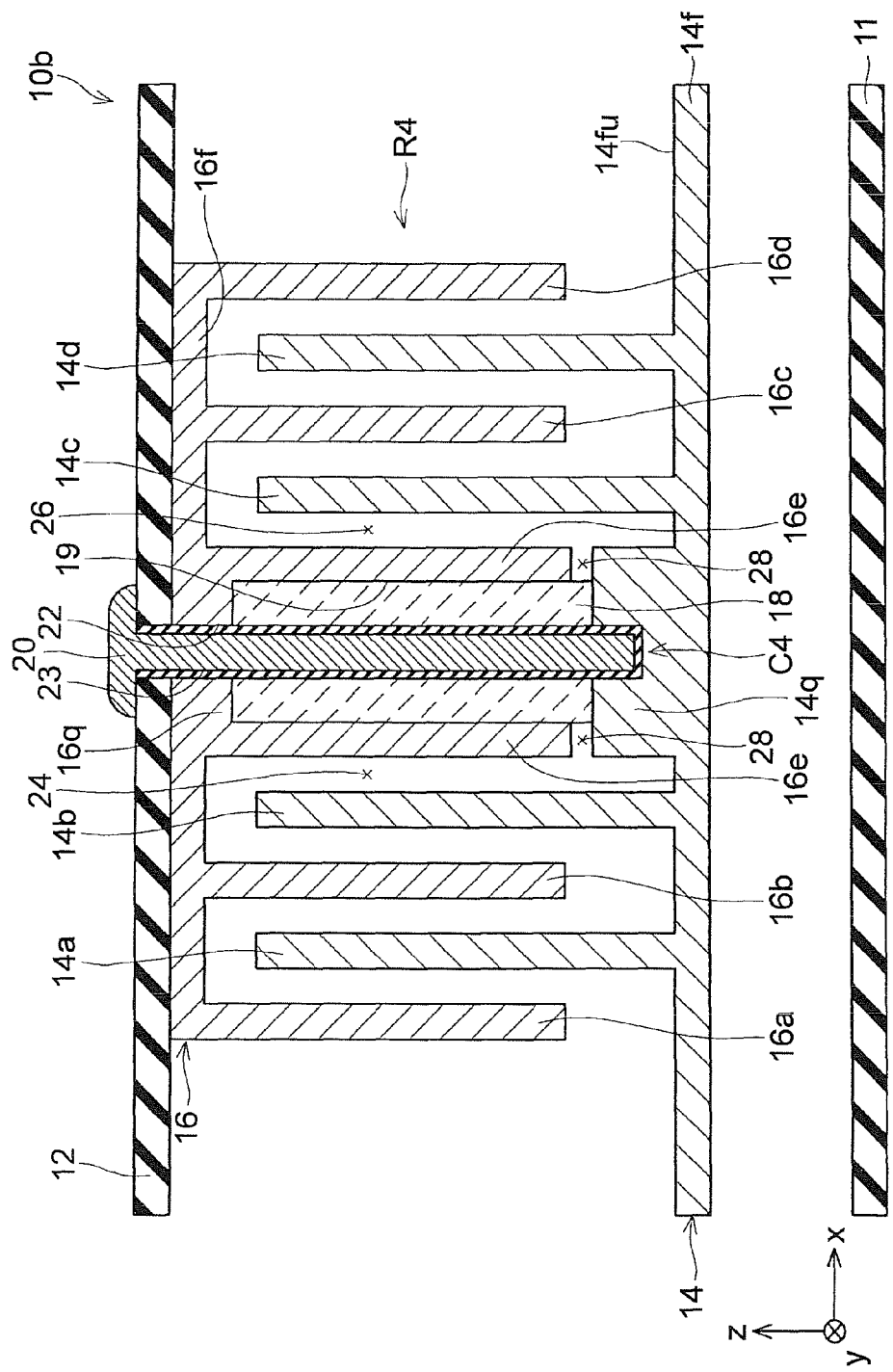
FIG. 5 is a sectional view of a semiconductor module according to another modified example of the first example embodiment.

Next, a second modified example of the first example embodiment will be described with reference to FIG. 5. Hereinafter, only points that differ from the first example embodiment will be described. Detailed descriptions of structure that is the same as that in the first example embodiment will be omitted.

With a semiconductor module 10b according to the second modified example, a radiation fin 16e and a protruding portion 16q have generally the same shapes as the radiation fin 14e and the protruding portion 14p of the first example embodiment, and a protruding portion 14q has generally the same shape as the protruding portion 16p of the first example embodiment. That is, a cavity 19 is formed by the radiation fin 16e and the protruding portion 16q, and an alumina plate 18 having a sectional shape substantially the same as that of the cavity 19 is arranged in the cavity 19. As shown in FIG. 5, a lower surface of the alumina plate 18 is formed at a lower position in the z direction than a lower surface of the radiation fin 16e. That is, when the alumina plate 18 is arranged such that an upper surface thereof is contacting an upper surface of the cavity 19, the lower surface of the alumina plate 18 protrudes slightly from the lower surface of the radiation fin 16e. The lower surface of the alumina plate 18 contacts an upper surface of the protruding portion 14q. As a result, a space 28 is formed between the upper surface of the protruding portion 14q and the lower surface of the radiation fin 16e. In this example embodiment, the screw hole 22 is formed through the alumina plate 18 to the protruding portion 14q. As a result, when the screw 20 is screwed into the screw hole 22, the IPM substrate 12, the metal member 16, the alumina plate 18, and the shield plate 14 are all fastened together contacting one another in this order. That is, the structure of the second modified example differs from the structure of the first example embodiment in that the cavity 19 for arranging the alumina plate 18 is formed on the metal member 16, not on the shield plate 14. As a result, a radiator R4 is formed, and a capacitor C4 in which the protruding portion 14q, the radiation fin 16e, and the protruding portion 16q are electrodes, is formed. This structure also provides the same advantages as those provided by the first example embodiment.

Figure 6:
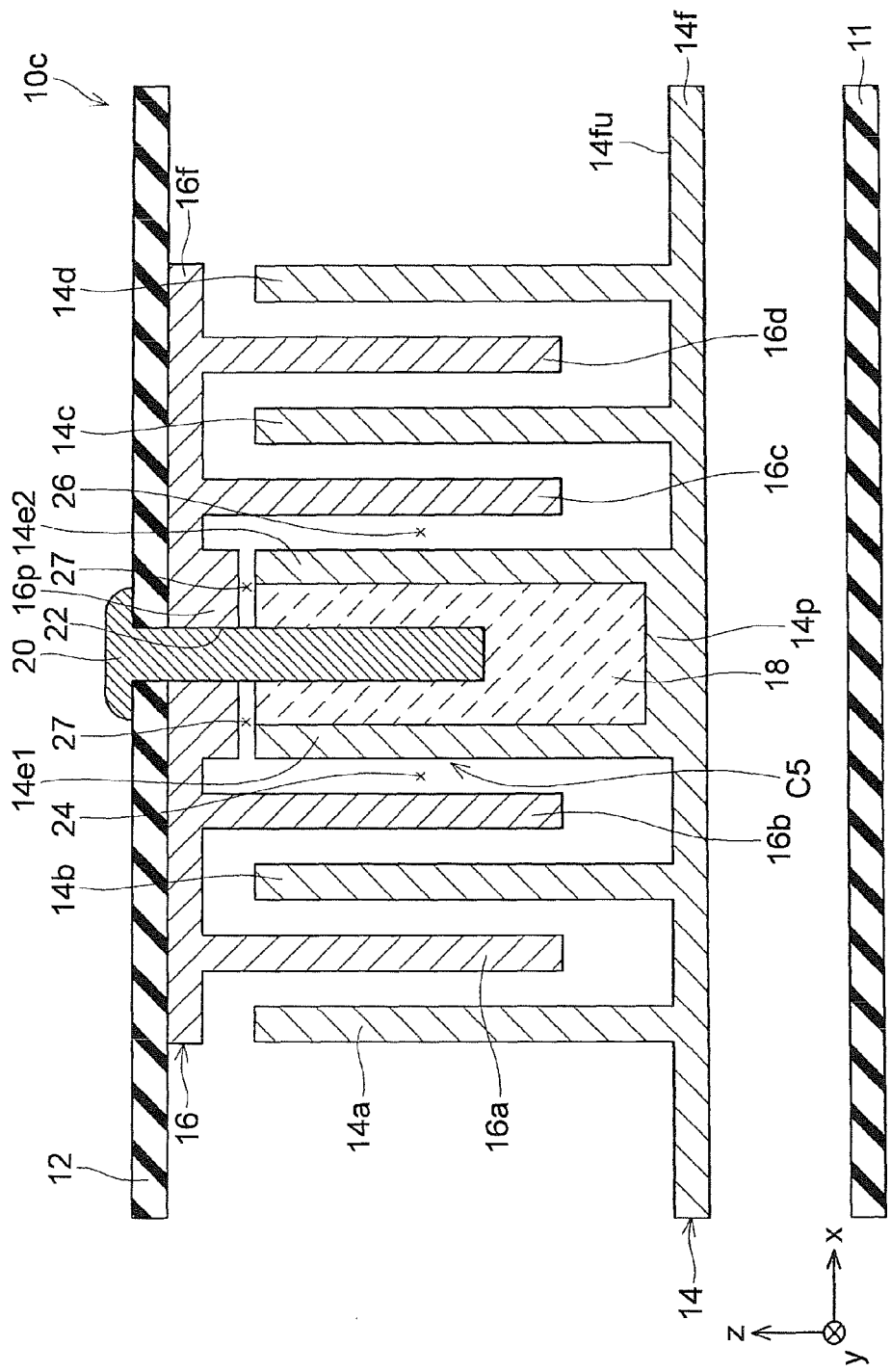
FIG. 6 is a sectional view of a semiconductor module according to a second example embodiment of the invention.

Next, a semiconductor module 10c according to a second example embodiment of the invention will be described with reference to FIG. 6. Hereinafter, only points that differ from the first example embodiment will be described. Detailed descriptions of structure that is the same as that in the first example embodiment will be omitted.

With the semiconductor module 10c according to the second example embodiment, the upper surface of the alumina plate 18 is formed at a height substantially the same as that of the upper surface of the radiation fin 14e in the z direction, and does not contact the lower surface of the protruding portion 16p of the metal member 16. That is, a space 27 is formed between the lower surface of the protruding portion 16p, and the upper surface of the radiation fin 14e and the upper surface of the alumina plate 18. Also, in this example embodiment, the insulating film 23 is not formed on the bottom surface and the inner peripheral surface of the screw hole 22.

With the semiconductor module 10c according to the second example embodiment, the insulating film 23 is not formed in the screw hole 22, so the screw 20 and the protruding portion 16p are electrically connected. Therefore, a capacitor C5 is formed by the screw 20 and the radiation fin 14e. More specifically, a shaft portion of the screw 20 and the radiation fin 14e function as electrodes of the capacitor C5. That is, with the capacitor C1 of the first example embodiment, both electrodes oppose each other in the z direction, but with the capacitor C5 of the second example embodiment, both electrodes oppose each another in the xy planar direction. This structure also provides the same advantages as those provided by the first example embodiment.

Figure 7:
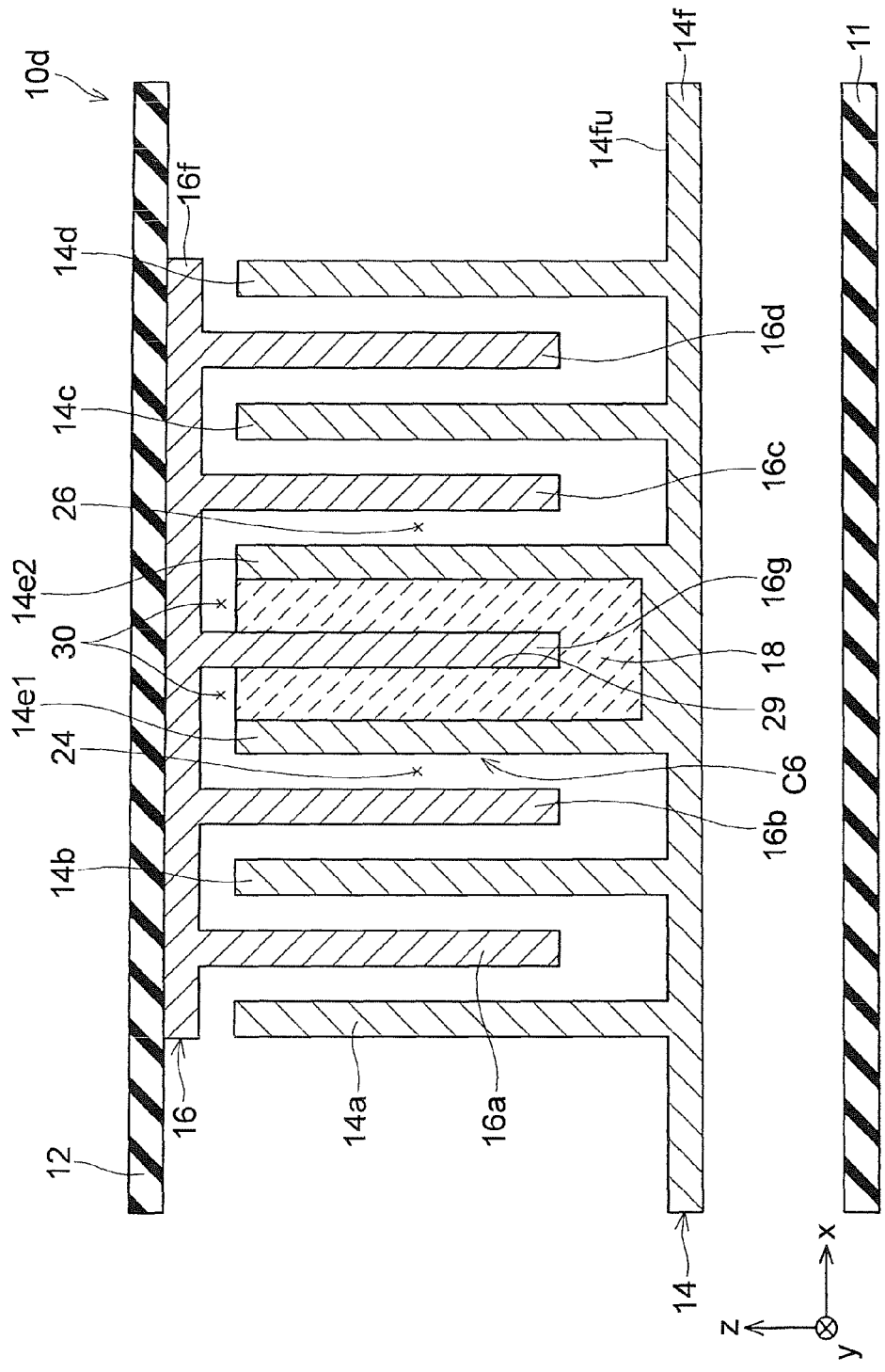
FIG. 7 is a sectional view of a semiconductor module according to a third example embodiment of the invention.

Next, a semiconductor module 10d according to a third example embodiment of the invention will be described with reference to FIG. 7. Hereinafter, only points that differ from the first example embodiment will be described. Detailed descriptions of structure that is the same as that in the first example embodiment will be omitted.

With the semiconductor module 10d according to the third example embodiment, a radiation fin 16g is formed instead of the protruding portion 16p, on the metal member 16. The radiation fin 16g has generally the same shape as that of the radiation fins 16a to 16d, and is formed perpendicular to the metal flat plate 16f, in substantially the center between the radiation fin 16b and the radiation fin 16c. The radiation fin 16g is formed such that the wide surface thereof is parallel to and opposes the wide surface of the radiation fin 16b (and the radiation fin 16c). On the other hand, a flat plate-shaped cavity 29 that extends long in the y direction is formed inside the alumina plate 18. This cavity 29 is open to the upper surface of the alumina plate 18, and is approximately the same length as the radiation fin 16g in the x direction and the y direction, but is slightly shorter than the radiation fin 16g in the z direction. Also, the height of the upper surface of the alumina plate 18 is substantially the same as the height of the upper surface of the radiation fin 14e. Therefore, when the radiation fin 16g is arranged in the cavity 29 such that the lower surface of the radiation fin 16g is contacting a bottom surface of the cavity 29, a space 30 is formed between the lower surface of the metal flat plate 16f, and upper surface of the radiation fin 14e and the upper surface of the alumina plate 18. The IPM substrate 12 and the shield plate 14 are fastened by a screw or the like in an appropriate location.

With the semiconductor module 10d in the third example embodiment, when the radiation fin 16g is arranged in the cavity 29, the wide surfaces of the radiation fin 16g and the radiation fin 14e1, and the radiation fin 16g and the radiation fin 14e2 are parallel and oppose each other. Therefore, a capacitor C6 is formed by the radiation fin 16g and the radiation fin 14e. This structure also provides the same advantages as those provided by the first example embodiment.

Heretofore, specific examples of the invention have been described in detail, but these are merely examples. The semiconductor module of the invention also includes various modifications of the specific examples described above.

For example, in the example embodiments, the radiation fins are formed by press-forming the shield plate 14, but a metal member having metal radiation fins may also be attached to the shield plate 14 later. In this case, the metal member described above may be regarded as one example of the second heat dissipating portion of the invention. Also, the material of the shield plate 14 and the metal member 16 is not limited to copper, but may be another metal, preferably one having high thermal conductivity. Also, the thickness of the radiation fins and the distance between adjacent radiation fins may be different. Also, a dielectric body may be arranged in the space 25, 28, 27, and 30. Arranging a dielectric body in the space described above makes it possible to prevent the metal member 16 and the shield plate 14 from coming into contact with each other (e.g., the protruding portion and the radiation fins from becoming electrically connected to each other) due to an assembly defect or the like when the IPM substrate 12 and the shield plate 14 are assembled. Also, as long as the dielectric body is able to be suitably arranged between the first heat dissipating portion and the second heat dissipating portion, the radiation fins 14a to 14e may be formed in a direction intersecting the shield flat plate upper surface 14fu, and similarly, the radiation fins 16a to 16d may be formed in a direction intersecting the metal flat plate 16f. Also, the alumina plate 18 does not have to be arranged in the entire cavity. Instead, the alumina plate 18 may be arranged at a portion where heat dissipating portions that become the electrodes of the capacitor oppose one another. Also, the IPM substrate 12 and the shield plate 14 may be fastened by a screw or the like in a location other than the location where the radiator (including the capacitor) is formed. Further, the capacitor may be a capacitor in which electrodes thereof oppose one another in the z direction, a capacitor in which the electrodes thereof oppose one another in the xy planar direction, or a capacitor formed of a combination of these.

Heretofore, specific examples of the invention have been described in detail, but these are merely examples, and the invention is not limited to these examples. The invention also includes various modifications of the specific examples described above. Also, the technical elements illustrated in the specification and the drawings exert technical utility both alone and in various combinations. Further, the technology illustrated in the specification and the drawings simultaneously achieves a plurality of objects, and has technical utility by simply achieving one of these objects.

What is claimed is:

1. A semiconductor module comprising:
   a control board having a surface;
   a shield plate arranged opposing the control board, the shield plate having a first surface opposing the surface of the control board, the surface of the control board and the first surface of the shield plate being parallel to each other;
   a first heat dissipating portion that is made of metal, the first heat dissipating portion being provided on the surface of the control board, the first heat dissipating portion having a plurality of first radiation fins, and the plurality of first radiation fins extending from the surface of the control board to the shield plate;
   a second heat dissipating portion that is made of metal, the second heat dissipating portion being provided on the first surface of the shield plate, the second heat dissipating portion having a plurality of second radiation fins, and the plurality of second radiation fins extending from the first surface of the shield plate toward the control board; and
   a dielectric body that is arranged between the first heat dissipating portion and the second heat dissipating portion,
   wherein the first radiation fins and the second radiation fins are alternately arranged in a direction parallel to the first surface.

2. The semiconductor module according to claim 1, wherein
   the second heat dissipating portion provided on the shield plate includes side surfaces of a quadrangular prism that extends from the shield plate toward the control board;
   the dielectric body is arranged directly contacting the first heat dissipating portion and the second heat dissipating portion, on an inside of the side surfaces of the quadrangular prism; and
   the dielectric body, a contact portion of the first heat dissipating portion that contacts the dielectric body, a contact portion of the second heat dissipating portion that contacts the dielectric body, and the side surfaces of the quadrangular prism form a capacitor.

3. The semiconductor module according to claim 2, wherein the side surfaces of the quadrangular prism is arranged between the plurality of first radiation fins, in a direction parallel to the first surface.

4. The semiconductor module according to claim 1, wherein
- the first heat dissipating portion provided on the control board includes side surfaces of a quadrangular prism that extends from the control board toward the shield plate;
- the dielectric body is arranged directly contacting the first heat dissipating portion and the second heat dissipating portion, on an inside of the side surfaces of the quadrangular prism; and
- the dielectric body, a contact portion of the first heat dissipating portion that contacts the dielectric body, a contact portion of the second heat dissipating portion that contacts the dielectric body, and the side surfaces of the quadrangular prism form a capacitor.

5. The semiconductor module according to claim 4, wherein the side surfaces of the quadrangular prism is arranged between the plurality of second radiation fins, in a direction parallel to the first surface.

6. The semiconductor module according to claim 1, further comprising
- a screw that passes through the control board and the first heat dissipating portion, wherein
- the second heat dissipating portion provided on the shield plate includes side surfaces of a quadrangular prism that extends from the shield plate toward the control board;
- the dielectric body is arranged directly contacting the second heat dissipating portion, on an inside of the side surfaces of the quadrangular prism;
- the dielectric body and the first heat dissipating portion are separated from each other so as to be electrically insulated;
- the first heat dissipating portion and the dielectric body are electrically connected by the screw; and
- the dielectric body, the screw, and the side surfaces of the quadrangular prism form a capacitor.

7. The semiconductor module according to claim 1, wherein
- the second heat dissipating portion provided on the shield plate includes side surfaces of a quadrangular prism that extends from the shield plate toward the control board;
- the dielectric body is arranged directly contacting the second heat dissipating portion, on an inside of the side surfaces of the quadrangular prism;
- the first radiation fins include a radiation fin that directly contacts the dielectric body; and
- the dielectric body, the radiation fin that directly contacts the dielectric body, and the side surfaces of the quadrangular prism form a capacitor.

8. The semiconductor module according to claim 1, wherein
- a space is formed by the first radiation fins and the second radiation fins.

9. The semiconductor module according to claim 8, wherein
- the first radiation fins and the second radiation fins are separated from each other so as to be electrically insulated.

10. The semiconductor module according to claim 1, wherein
- a module equipped with an insulated gate bipolar transistor is arranged on a second surface of the shield plate.

11. The semiconductor module according to claim 10, wherein
- the module equipped with the insulated gate bipolar transistor is cooled with coolant.

12. The semiconductor module according to claim 1, wherein the dielectric body is an alumina plate.

13. A semiconductor module comprising:
- a control board having a surface;
- a shield plate arranged opposing the control board, the shield plate having a first surface opposing the surface of the control board, the surface of the control board and the first surface of the shield plate being parallel to each other;
- a first heat dissipating portion that is made of metal, the first heat dissipating portion being provided on the surface of the control board, the first heat dissipating portion having a plurality of first radiation fins, and the plurality of first radiation fins extending from the surface of the control board to the shield plate;
- a second heat dissipating portion that is made of metal, the second heat dissipating portion being provided on the first surface of the shield plate, the second heat dissipating portion having a plurality of second radiation fins, and the plurality of second radiation fins extending from the first surface of the shield plate toward the control board, the second heat dissipating portion includes side surfaces of a quadrangular prism that extends from the shield plate toward the control board; and
- a dielectric body that is arranged between the first heat dissipating portion and the second heat dissipating portion, the dielectric body is arranged directly contacting the first heat dissipating portion and the second heat dissipating portion, on an inside of the side surfaces of the quadrangular prism,
- wherein the dielectric body, a contact portion of the first heat dissipating portion that contacts the dielectric body, a contact portion of the second heat dissipating portion that contacts the dielectric body, and the side surfaces of the quadrangular prism form a capacitor.

14. The semiconductor module according to claim 13, wherein the side surfaces of the quadrangular prism is arranged between the plurality of first radiation fins, in a direction parallel to the first surface.

15. A semiconductor module comprising:
- a control board having a surface;
- a shield plate arranged opposing the control board, the shield plate having a first surface opposing the surface of the control board, the surface of the control board and the first surface of the shield plate being parallel to each other;
- a first heat dissipating portion that is made of metal, the first heat dissipating portion being provided on the surface of the control board, the first heat dissipating portion having a plurality of first radiation fins, the plurality of first radiation fins extending from the surface of the control board to the shield plate, and the first heat dissipating portion includes side surfaces of a quadrangular prism that extends from the control board toward the shield plate;
- a second heat dissipating portion that is made of metal, the second heat dissipating portion being provided on the first surface of the shield plate, the second heat dissipating portion having a plurality of second radiation fins, and the plurality of second radiation fins extending from the first surface of the shield plate toward the control board; and
- a dielectric body that is arranged between the first heat dissipating portion and the second heat dissipating portion, the dielectric body is arranged directly contacting the first heat dissipating portion and the second heat dissipating portion, on an inside of the side surfaces of the quadrangular prism, wherein the dielectric body, a contact portion of the first heat dissipating portion that contacts the dielectric body, a contact portion of the second heat dissipating portion that contacts the dielectric body, and the side surfaces of the quadrangular prism form a capacitor.

16. The semiconductor module according to claim 15, wherein the side surfaces of the quadrangular prism is arranged between the plurality of second radiation fins, in a direction parallel to the first surface.

* * * * *